United States Patent [19]
Kim

[11] Patent Number: 6,090,652
[45] Date of Patent: Jul. 18, 2000

[54] METHOD OF MANUFACTURING A SEMICONDUCTOR DEVICE INCLUDING IMPLANTING THRESHOLD VOLTAGE ADJUSTMENT IONS

[75] Inventor: Jae-Kap Kim, Ich'on, Rep. of Korea

[73] Assignee: Hyundai Electronics Industries Co., Ltd., Kyoungki-do, Rep. of Korea

[21] Appl. No.: 08/996,011

[22] Filed: Dec. 22, 1997

[30] Foreign Application Priority Data

Dec. 28, 1996 [KR] Rep. of Korea ................. 96-75454

[51] Int. Cl.⁷ ............................................. H01L 21/8238
[52] U.S. Cl. ..................... 438/228; 438/199; 438/231; 438/232; 438/225; 438/227; 438/203; 438/201; 438/209; 438/200; 438/358; 438/328; 438/529; 438/268
[58] Field of Search ................................. 458/199, 231, 458/232, 228, 225, 227, 203, 201, 209, 200, 358, 328; 438/529, 268

[56] References Cited

U.S. PATENT DOCUMENTS

| | | | |
|---|---|---|---|
| 4,651,406 | 3/1987 | Shimizu et al. | 29/571 |
| 5,047,358 | 9/1991 | Kosiak et al. | 437/34 |
| 5,407,840 | 4/1995 | Manoliu et al. | 437/31 |
| 5,468,666 | 11/1995 | Chapman | 437/44 |
| 5,472,887 | 12/1995 | Hutter et al. | 437/34 |
| 5,498,554 | 3/1996 | Mei | 437/34 |
| 5,527,722 | 6/1996 | Hutter et al. | 437/34 |
| 5,804,497 | 9/1998 | Gardner et al. | 438/529 |
| 5,830,789 | 11/1998 | Lien et al. | 438/217 |
| 5,917,218 | 6/1999 | Choi et al. | 257/345 |
| 5,981,327 | 11/1999 | Kim | 438/228 |
| 6,022,778 | 2/2000 | Contiero et al. | 438/268 |

*Primary Examiner*—John F. Niebling
*Assistant Examiner*—Viktor Simkovic

[57] ABSTRACT

Disclosed is a manufacturing method of semiconductor device which can simplify the manufacturing procedures for transistors with different gate insulation film thickness in the same substrate. According to the present invention, a manufacturing method for semiconductor device having NMOS and PMOS transistors with gate insulation films of different thickness from each other, is formed by the following processes. First, a semiconductor substrate in which a low voltage NMOS transistor region, a high voltage NMOS transistor region, a low voltage PMOS transistor region, and a high voltage PMOS transistor region are defined by isolation films, is provided. Next, a N well is formed in the low and high voltage PMOS transistor regions and threshold voltage adjustment ions for high voltage PMOS transistor are then implanted into the N well. Afterward, a P well is formed in the low and high voltage NMOS transistor regions and threshold voltage adjustment ions for low voltage NMOS transistor are then implanted into the P well. Next, a mask pattern exposing the high voltage NMOS transistor region and the low voltage PMOS transistor region is formed on the substrate. Threshold voltage adjustment ions for low voltage PMOS transistor are implanted into the exposed P well of the high voltage NMOS transistor region and the N well of the low voltage PMOS transistor region and the mask pattern is then removed. Next, a first gate insulation film is formed on the substrate and the first gate insulation film existing on the low voltage NMOS and PMOS transistors regions is removed. A second gate insulation film is then formed on the substrate.

15 Claims, 6 Drawing Sheets

METHOD OF MANUFACTURING A SEMICONDUCTOR DEVICE INCLUDING IMPLANTING THRESHOLD VOLTAGE ADJUSTMENT IONS

BACKGROUND OF THE INVENTION

1. Field of the Invention

The present invention relates to a manufacturing method of a semiconductor device, and more particularly to a manufacturing method of a semiconductor device having gate insulation films of different thickness in the same substrate.

2. Description of the Related Art

Due to recent high integration and complication of function in semiconductor devices, special capabilities are generally requested therein. In a highly integrated semiconductor device, such as a device having a pitch of a half micron or less, the supply voltage must be in the range of 3.3 to 5 volts or less in order to reduce power consumption and to improve device reliability. For instance, supply voltages for micro processors or memory devices are already standardized to have low voltage supplies such as 2.5 or 3.3 volts. However, these low voltage devices are still used with high voltage devices, i.e., devices using 5 volts, to form an electronic system. Hence, to interface low voltage semiconductor devices with exterior devices requiring high voltage, high voltage transistors having gate insulation films with endurance to high voltage must be equipped within the low voltage semiconductor devices.

To ensure the reliability of the gate insulation films for high voltage, the gate insulation films of the high voltage transistors are thicker than those of low voltage transistors. However, these high voltage transistors have higher threshold current due to increased thickness of the gate insulation films. Every $10^{\text{Å}}$ increase in the thickness of the gate insulation film results in 0.05 to 0.1 volt increases in threshold voltage. Therefore, impurity concentration for threshold voltage adjustment in high voltage transistors must be set differently to that in low voltage transistors.

To adjust the threshold voltage for transistors having different gate insulation film thickness on the same substrate, the conventional method was to set the impurity concentrations of the wells such that impurity concentration of the well for the high voltage transistor is different from that for the low voltage transistor. However, to optimize the threshold voltage for a respective NMOS transistor and a PMOS transistor having different gate insulation film thickness formed on the same substrate, four masking steps are required. More specifically, the above masking steps are, first masking step for forming a first P well where a low voltage NMOS transistor is to be formed; second masking step for forming a second P well where a high voltage NMOS transistor is to be formed; third masking step for forming a first N well where a low voltage PMOS transistor is to be formed; and fourth masking step for forming a second N well where a high voltage PMOS transistor is to be formed. Therefore, the manufacturing steps are complicated and the manufacturing period is quite long.

SUMMARY OF THE INVENTION

The object of the present invention is to provide a novel manufacturing method of semiconductor devices which can optimize different threshold voltages for high and low voltage transistors formed in the same substrate with simple process.

To accomplish the above described object, according to one embodiment of the present invention, a manufacturing method of semiconductor device having NMOS and PMOS transistors with gate insulation films of different thickness from each other, is formed by the following processes. First, a semiconductor substrate in which a low voltage NMOS transistor region, a high voltage NMOS transistor region, a low voltage PMOS transistor region, and a high voltage PMOS transistor region are defined by isolation films, is provided. Next, a N well is formed in the low and high voltage PMOS transistor regions and threshold voltage adjustment ions for high voltage PMOS transistor are then implanted into the N well. Afterward, a P well is formed in the low and high voltage NMOS transistor regions and threshold voltage adjustment ions for low voltage NMOS transistor are then implanted into the P well. Next, a mask pattern exposing the high voltage NMOS transistor region and the low voltage PMOS transistor region is formed on the substrate. Threshold voltage adjustment ions for low voltage PMOS transistor are implanted into the exposed P well of the high voltage NMOS transistor region and the N well of the low voltage PMOS transistor region and the mask pattern is then removed. Next, a first gate insulation film is formed on the substrate and the first gate insulation film existing on the low voltage NMOS and PMOS transistors regions is removed. A second gate insulation film is then formed on the substrate.

To accomplish the above described object, according to another embodiment of the present invention, a manufacturing method for semiconductor device having NMOS and PMOS transistors with gate insulation films of different thickness from each other, is formed by the following processes. First, a semiconductor substrate in which a low voltage NMOS transistor region, a high voltage NMOS transistor region, a low voltage PMOS transistor region, and a high voltage PMOS transistor region are defined by isolation films is provided. Next, a N well is formed in the low and high voltage PMOS transistor regions and threshold voltage adjustment ions for low voltage PMOS transistor into the N well are implanted. A P well is then formed in the low and high voltage NMOS transistor regions and threshold voltage adjustment ions for high voltage NMOS transistor are implanted into the P well. Afterward, a mask pattern exposing the low voltage NMOS transistor regions and the high voltage PMOS transistor region is formed on the substrate. Threshold voltage adjustment ions for low voltage NMOS transistor are implanted into the exposed P well of the low voltage NMOS transistor region and the N well of the high voltage PMOS transistor region and then the mask pattern is removed. A first gate insulation film is formed on the substrate and the first gate insulation film existing on the low voltage NMOS and PMOS transistor regions is then removed. Next, a second gate insulation film is formed on the substrate.

According to the above descriptions of the present invention, after the threshold voltages of the high voltage PMOS transistor and the low voltage NMOS transistor are adjusted, the threshold voltages of the high voltage NMOS transistor and the low voltage PMOS transistor are adjusted by the threshold voltage adjustment ions for the low voltage PMOS transistor. Alternatively, after the threshold voltages of the low voltage PMOS transistor and the high voltage NMOS transistor are adjusted, the threshold voltages of the low voltage NMOS transistor and the high voltage PMOS transistor are adjusted by the threshold voltage adjustment ions for the low voltage NMOS transistor. Accordingly, threshold voltages of high and low voltage transistors having different gate insulation film thickness from with each other on the same substrate, can be optimized with a small number of manufacturing steps.

DETAILED DESCRIPTION OF THE INVENTION

A detailed description of the embodiments of the present invention is given below with reference to the drawings.

Figure 1A:
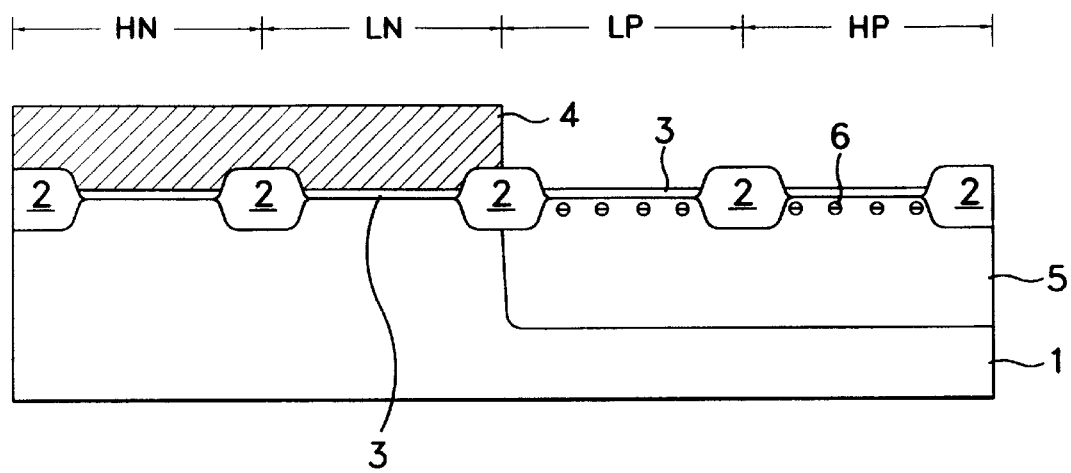
FIG. 1A through FIG. 1F are sectional views showing a manufacturing method of semiconductor devices according to one embodiment of the present invention.
Figure 1B:
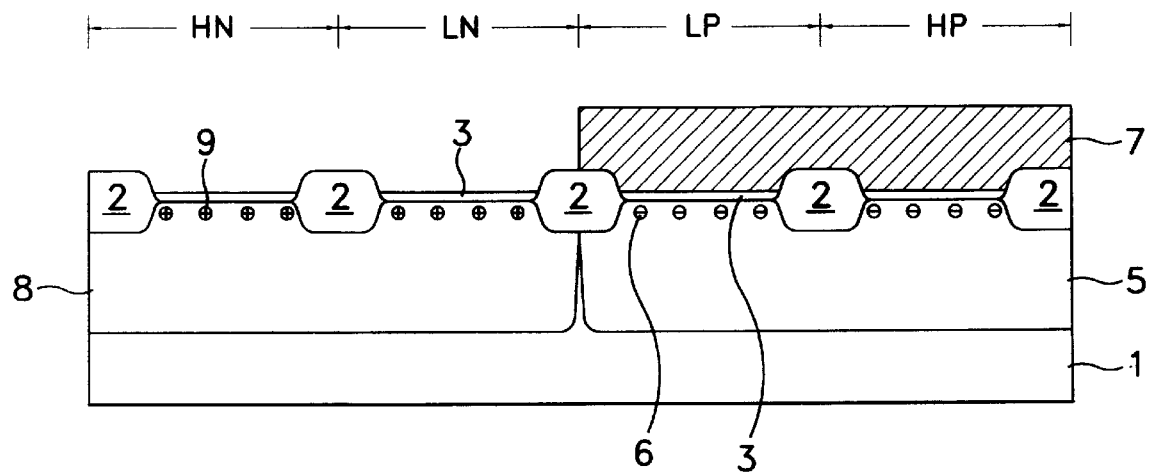
Figure 1C:
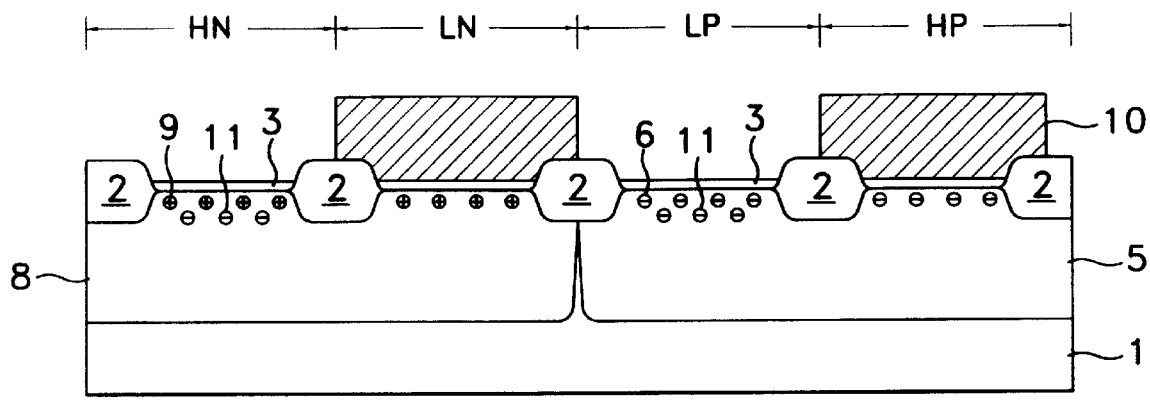
Figure 1D:
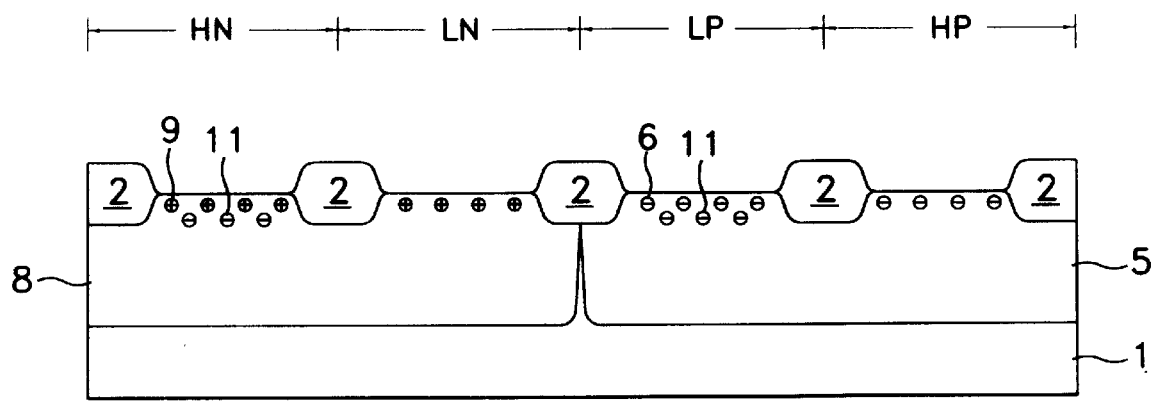
Figure 1E:
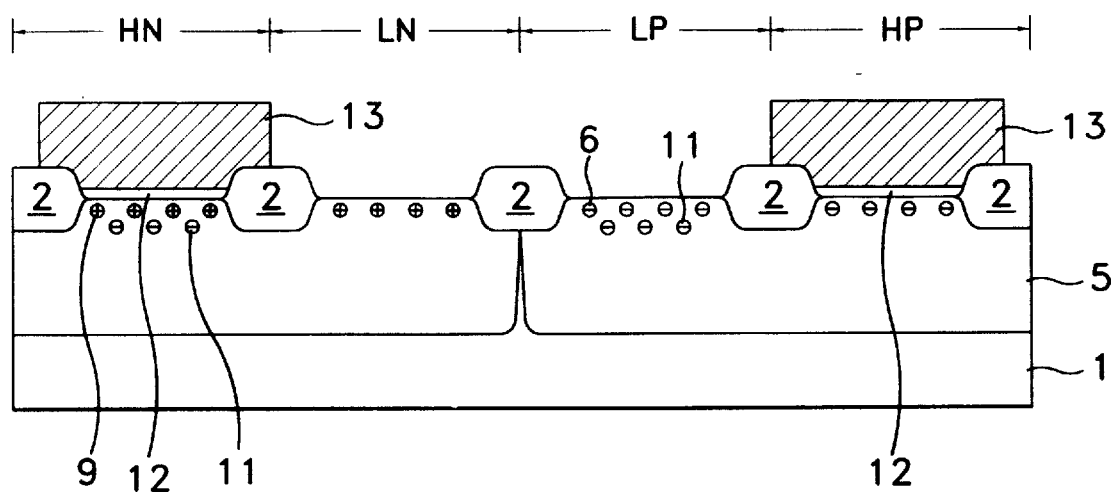
Figure 1F:
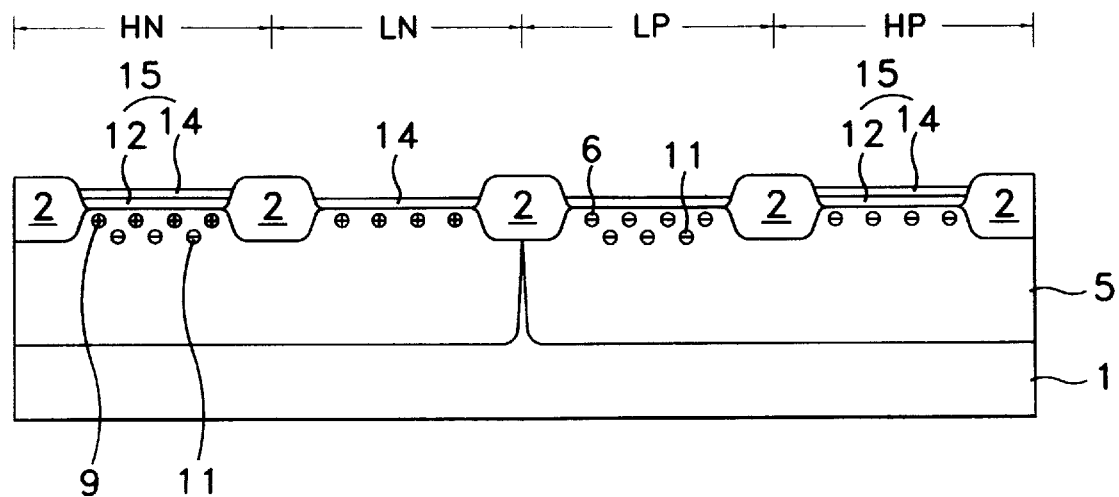
Figure 2A:
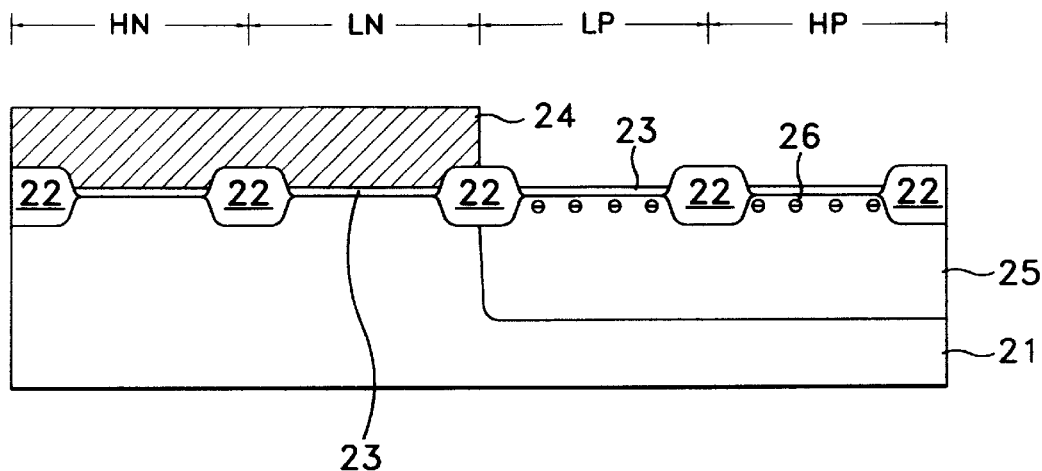
FIG. 2A through FIG. 2F are sectional views showing a manufacturing method of semiconductor devices according to another embodiment of the present invention.

FIG. 2A through FIG. 1F are sectional views showing a manufacturing method of semiconductor devices according to one embodiment of the present invention.

Referring to FIG. 1A, isolation films 2 are formed on a semiconductor substrate 1 by a conventional LOCOS (LOCal Oxidation of Silicon) method, to define high and low voltage NMOS transistor regions HN and LN, and high and low voltage PMOS transistor regions HP and LP. It will be shown later that the gate insulation films for the high and low voltage transistors have different thickness from each other. Next, a screen oxide film 3 is deposited over the substrate 1. A first mask pattern 4 exposing the PMOS transistor regions LP and HP and masking the NMOS transistor regions LN and HN, is then formed by photolithography method. Afterwards, N type impurity ions, preferably P (phosphorus) ions are implanted into the exposed the PMOS transistor regions LP and HP with an energy of 700 KeV to 1.5 MeV and a concentration of $1 \times 10^{13}$ to $5 \times 10^{13}$ ions/cm$^2$ and are then heat-treated, so that a N well 5 is formed. Next, a first N type impurity ions 6, preferably P ions for the threshold voltage adjustment of the high voltage PMOS transistor are twice implanted into the N well 5. More specifically, the P ions are firstly implanted with an energy of 180 to 250 KeV and a concentration of $5 \times 10^{12}$ to $2 \times 10^{13}$ ions/cm$^2$, and then secondly implanted with an energy level of 30 to 80 KeV and a concentration of $5 \times 10^{11}$ to $5 \times 10^{12}$ ions/cm$^2$. The threshold voltage of the high voltage PMOS transistor due to this process is set to about –0.5 to –0.8 volts.

Referring to FIG. 1B, the first mask pattern 4 is removed by a well-known method. A second mask pattern 7 exposing the NMOS transistor regions HN and LN and masking the PMOS transistor regions HP and LP, is formed over the substrate 1 by photolithography method. Afterwards, P type impurity ions, preferably B (boron) ions are implanted into the exposed NMOS transistor regions HN and LN with an energy of 500 to 700 KeV, and a concentration of $1 \times 10^{13}$ to $5 \times 10^{13}$ ions/cm$^2$, and then heat-treated, so that a P well 8 is formed. Next, P type impurity ions, preferably B ions 9 for the threshold voltage adjustment of the low voltage NMOS transistor are twice implanted into the P well 8. More specifically, the B ions are firstly implanted with an energy of 70 to 120 KeV and a concentration of $5 \times 10^{12}$ to $2 \times 10^{13}$ ions/cm$^2$, then secondly implanted with an energy of 10 to 30 KeV and a concentration of $1 \times 10^{12}$ to $5 \times 10^{12}$ ions/cm$^2$. The threshold voltage of the low voltage NMOS transistor due to this process is set to about 0.5 to 0.8 volts.

Referring to FIG. 1C, the second mask pattern 7 is removed by a well-known method. Afterwards, a third mask pattern 10 exposing the high voltage NMOS transistor region HN and the low voltage PMOS transistor region LP, and masking the low voltage NMOS transistor region LN and the high voltage PMOS transistor region HP, is formed over the substrate 1. Afterwards, a second N type impurity ions 11, preferably P ions for the threshold voltage adjustment of the low voltage PMOS transistor are implanted into the P well 8 of the exposed high voltage NMOS transistor region HN and into the N well 5 of the exposed low voltage PMOS transistor region LP. In this process, the P ions 11 are implanted with an energy level of 30 to 80 KeV and a concentration of $1 \times 10^{12}$ to $8 \times 10^{12}$ ions/cm$^2$. Therefore, as the first N type impurity ions 6 and the second N type impurity ions 11 are combined in the low voltage PMOS transistor region LP, the threshold voltage of the low voltage PMOS transistor fall in the range of –0.5 to –0.8 volts. Due to the counter doping between the P type impurity ions 9 and the second N type impurity ions 11 at the high voltage NMOS transistor region HN, the threshold voltage for the high voltage NMOS transistor fall in the range of 0.5 to 0.8 volts.

As described above, the threshold voltages for the high voltage PMOS transistor and the low voltage NMOS transistor are adjusted by the respective ion implanting using the first and the second mask patterns 4 and 7 as ion implanting masks. Afterwards, the threshold voltages for the high voltage NMOS transistor and the low voltage PMOS transistor are adjusted by the ion implanting using the third mask pattern 10 as an ion implanting mask. Hence, the threshold voltages for the high and low voltage transistors which will have gate insulation films of different thickness in the same substrate in the later process is optimized with only three masking processes.

Referring to FIG. 1D, the third mask pattern 10 and the screen oxide film 3 are removed by a well-known method. Referring to FIG. 1E, a first gate insulation film 12 is formed on the substrate 1. Next, a fourth mask pattern 13 exposing the low voltage NMOS and PMOS transistor regions LN and LP, and masking the first gate insulation film 12 of the high voltage NMOS and PMOS transistor regions HN and HP, is formed over the substrate by photolithography method. The exposed the first gate insulation film 12 is then removed by an etching process using the fourth mask pattern 13 as a etch mask.

Referring to FIG. 1F, the fourth mask pattern 13 is removed by a conventional method and a second gate insulation film 14 is then formed over the substrate 1. Since the gate insulation films 15 for the high voltage NMOS and PMOS transistor regions HN and HP are consisted of the first and second gate insulation films 12 and 14, they are thicker than those of the low voltage NMOS and PMOS transistor regions LN and LP in which it is solely of the second gate insulation film 14.

In the above described embodiment, the threshold voltages of the high voltage PMOS transistor and the low voltage NMOS transistor are adjusted by the first N type impurity ions 6 for the threshold voltage adjustment of the high voltage PMOS transistor and the P type impurity ions 9 for threshold voltage adjustment of the low voltage PMOS transistor, and those of the low voltage PMOS transistor and the high voltage NMOS transistor are then adjusted by the second N type impurity ions 11 for the threshold voltage adjustment of the low voltage PMOS transistor.

Alternatively, the threshold voltages for the low voltage PMOS transistor and the high voltage NMOS transistor can be adjusted by the N type impurity ions for the threshold voltage adjustment of the low voltage PMOS transistor and the first P type impurity ions for the threshold voltage adjustment of the high voltage NMOS transistor, and those of the high voltage PMOS transistor and the low voltage NMOS transistor can be adjusted by the second P type impurity ions for the threshold voltage adjustment of the high voltage NMOS transistor.

FIG. 2A through FIG. 2F are sectional views showing a manufacturing method of semiconductor devices according to another embodiment of the present invention using the description above.

Referring to FIG. 2A, isolation films 22 are formed on a semiconductor substrate 21 by a conventional LOCOS (LOcal Oxidation of Silicon) method, to define high and low voltage NMOS transistor regions HN and LN, and high and low voltage PMOS transistor regions HP and LP. It will be shown later that the gate insulation films for the high and low voltage transistors have different thickness from each other. Next, a screen oxide film 23 is deposited over the substrate 21. A first mask pattern 24 exposing the PMOS transistor regions LP and HP and masking the NMOS transistor regions LN and HN, is formed by photolithography method. Afterwards, N type impurity ions, preferably P(phosphorus) ions are implanted into the exposed PMOS transistor regions LP and HP with an energy of 700 KeV to 1.5 MeV and a concentration of $1 \times 10^{13}$ to $5 \times 10^{13}$ ions/cm$^2$, and then heating-treated, so that a N well 25 is formed. Next, N type impurity ions 26, preferably P ions for the threshold voltage adjustment of the low voltage PMOS transistor are twice implanted into the N well 25. More specifically, the P ions are firstly implanted with an energy of 180 to 250 KeV and a concentration of $5 \times 10^{12}$ to $2 \times 10^{13}$ ions/cm$^2$, and then secondly implanted with an energy of 30 to 80 KeV and a concentration of $2 \times 10^{12}$ to $8 \times 10^{12}$ ions/cm$^2$. The threshold voltage Vt of the low voltage PMOS transistor due to this process is set to about $^-$0.5 to $^-$0.8 volts.

Figure 2B:
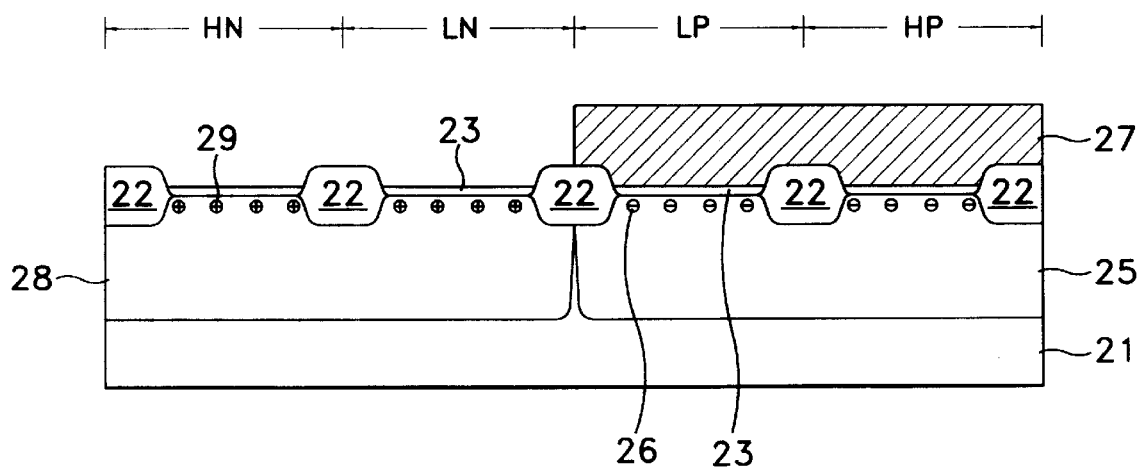

Referring to FIG. 2B, the first mask pattern 24 is removed by a well-known method. A second mask pattern 27 exposing the NMOS transistor regions HN and LN and masking the PMOS transistor regions HP and LP, is then formed over the substrate 21 by photolithography method. Afterwards, P type impurity ions, preferably B (boron) ions into the exposed NMOS transistor regions LN and HN with an energy level of 500 to 700 KeV and a concentration of $1 \times 10^{13}$ to $5 \times 10^{13}$ ions/cm$^2$, and then heat-treated, so that a P well 28 is formed. Next, a first P type impurity ions, preferably B ions 9 for the threshold voltage adjustment of the high voltage NMOS transistor are twice implanted into the P well 28. More specifically, the B ions are first implanted with an energy of 70 to 120 KeV and a concentration of $5 \times 10^{12}$ to $2 \times 10^{13}$ ions/cm$^2$, then secondly implanted with an energy of 10 to 30 KeV and a concentration of $2 \times 10^{11}$ to $3 \times 10^{12}$ ions/cm$^2$. In this process, the second ion implanting can be omitted. The threshold voltage of the low voltage NMOS transistor due to this process is set to about 0.5 to 0.8 volts.

Figure 2C:
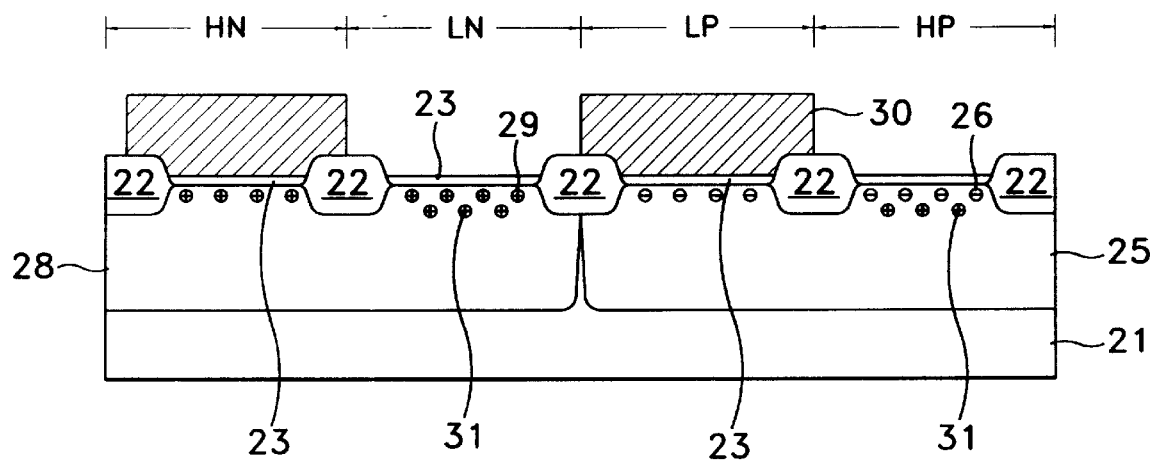

Referring to FIG. 2C, the second mask pattern 27 is removed by a well-known method. Afterwards, a third mask pattern 30 exposing the low voltage NMOS transistor region LN and the high voltage PMOS transistor region HP, and masking the high voltage NMOS transistor region HN and the low voltage PMOS transistor region LP, is formed over the substrate 21. Next, a second P type impurity ions 31, preferably B ions for the threshold voltage adjustment of the low voltage NMOS transistor are implanted into the P well 28 of the exposed low voltage NMOS transistor region LN and into the N well 25 of the exposed high voltage PMOS transistor region HP. In this process, the B ions 31 are implanted with an energy of 10 to 30 KeV and a concentration of $1 \times 10^{12}$ to $5 \times 10^{12}$ ions/cm$^2$. Therefore, as the first P type impurity ions 29 and the second P type impurity ions 31 are combined in the low voltage NMOS transistor region LN, the threshold voltage of the low voltage NMOS transistor fall in the range of 0.5 to 0.8 volt. Due to the counter doping between the N type impurity ions 26 and the second P type impurity ions 31 at the high voltage PMOS transistor region HP, the threshold voltage for the high voltage PMOS transistor fall in the range of $^-$0.5 to $^-$0.8 volts.

As described above, the threshold voltages for the high voltage NMOS transistor and the low voltage PMOS transistor are adjusted by the respective ion implanting using the first and the second mask patterns 24 and 27 as ion implanting masks. Afterwards, the threshold voltages for the low voltage NMOS transistor and the high voltage PMOS transistor are adjusted by the ion implanting using the third mask pattern 30 as an ion implanting mask. Hence, the threshold voltages for the high and low voltage transistors which will have gate insulation films of different thickness in the same substrate in the later process is optimized with only three masking processes.

Figure 2D:
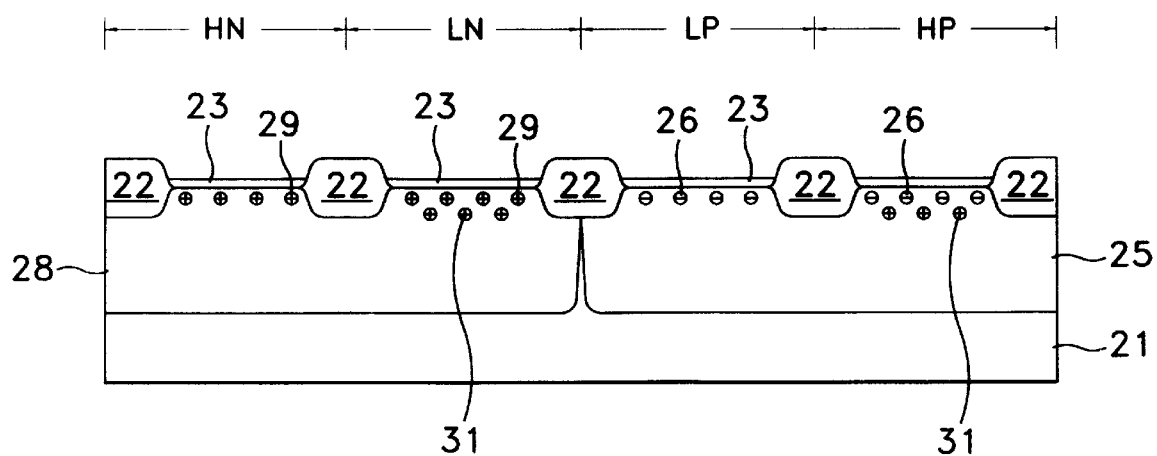
Figure 2E:
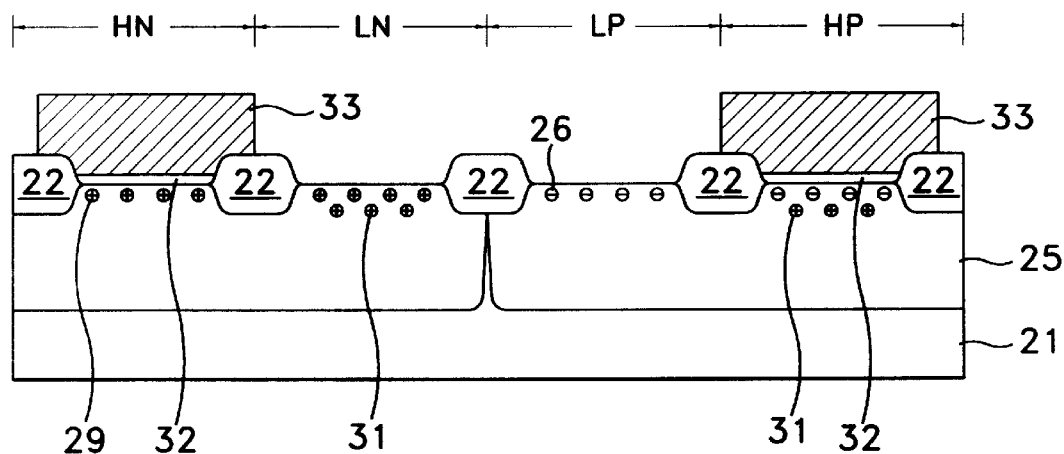

Referring to FIG. 2D, the third mask pattern 30 and the screen oxide film 23 are removed by a well-known method. Referring to FIG. 2E, a first gate insulation film 32 is formed on the substrate 21. Next, a fourth mask pattern 33 exposing the first gate insulation film 32 of the low voltage NMOS and PMOS transistor regions LN and LP, and masking the first gate insulation film 32 of the high voltage NMOS and PMOS transistor regions HN and HP, is formed over the substrate 21 by photolithography method. Then, the exposed first gate insulation film 32 is removed by etching process using the fourth mask pattern 33 as an etching mask.

Figure 2F:
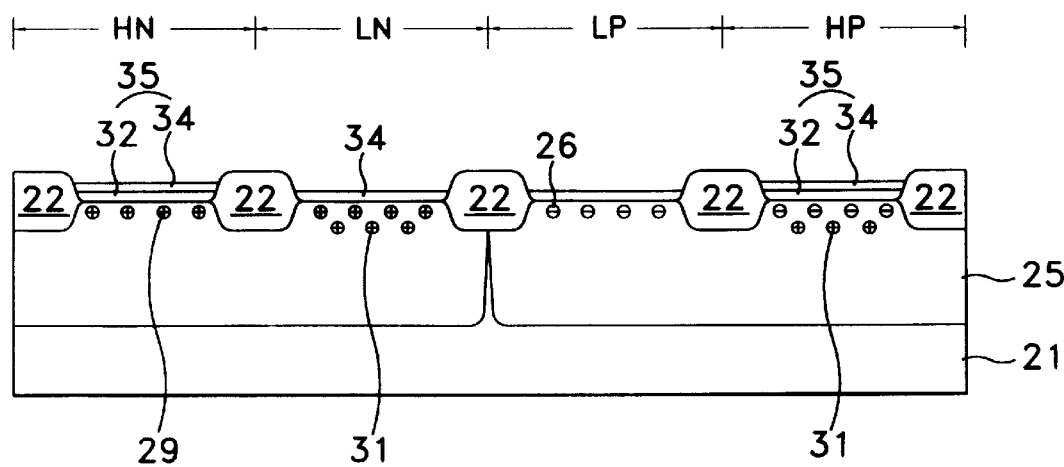

Referring to FIG. 2F, the fourth mask pattern 33 is removed by a well-known method and a second gate insulation film 34 is then deposited over the substrate 21. Since the gate insulation films 35 for the high voltage NMOS and PMOS transistor regions HN and HP are consisted of the first and second gate insulation films 32 and 34, they are thicker than those of the low voltage NMOS and PMOS transistor regions LN and LP in which it is solely of the second gate insulation film 34.

The threshold voltages for the respective PMOS and NMOS transistors which have gate insulation films of different thickness in the same substrate is optimized with only three masking processes. Hence, the manufacturing process step is reduced and since the manufacturing period can also be reduced, the device yield can be enhanced.

While this invention has been described with reference illustrative embodiments, this description is not intended to be construed in a limiting sense. Various modifications of illustrative embodiments, as well as other embodiments of the invention, will be apparent to persons skilled in the art upon reference to this description. It is therefore contemplated that the appended claims will cover any such modifications of embodiments as falling within the true scope of the invention.

What is claimed is:

1. A method of manufacturing a semiconductor device having NMOS and PMOS transistors with gate insulation films of different thickness from each other comprising the steps of:

providing a semiconductor substrate in which a low voltage NMOS transistor region, a high voltage NMOS transistor region, a low voltage PMOS transistor region, and a high voltage PMOS transistor region are defined by isolation films;

forming a N well in the low and high voltage PMOS transistor regions;

implanting threshold voltage adjustment ions for high voltage PMOS transistor into the N well;

forming a P well in the low and high voltage NMOS transistor regions;

implanting threshold voltage adjustment ions for low voltage NMOS transistor into the P well;

forming a mask pattern exposing the high voltage NMOS transistor region and the low voltage PMOS transistor region on the substrate;

implanting threshold voltage adjustment ions for low voltage PMOS transistor into the exposed P well of the high voltage NMOS transistor region and the N well of the low voltage PMOS transistor region;

removing the mask pattern;

wherein the steps of implanting threshold voltage adjustment ions for the high voltage PMOS transistor, comprises the steps of:

a first implanting of P ions with a first energy and a first concentration and a second implanting of P ions with a second energy which is different from the first energy, and a second concentration which is different from the first concentration.

2. The method as claimed in claim 1, further comprising the steps of:

forming a first gate insulation film on the substrate;

removing the first gate insulation film existing on the low voltage NMOS and PMOS transistors regions; and forming a second gate insulation film on the substrate.

3. The method as claimed in claim 1, wherein the N well is formed by implanting P ions with an energy of 700 KeV to 1.5 MeV and a concentration of $1\times10^{13}$ to $5\times10^{13}$ ions/cm$^2$.

4. The method as claimed in claim 1, wherein the step of implanting threshold voltage adjustment ions for high voltage PMOS transistor, comprises the steps of a first implanting P ions with an energy of 180 to 250 KeV and a concentration of $5\times10^{12}$ to $2\times10^{13}$ ions/cm$^2$ and a second implanting P ions with energy of 30 to 80 KeV and a concentration of $5\times10^{11}$ to $5\times10^{12}$ ions/cm$^2$.

5. The method as claimed in claim 1, wherein the P well is formed by implanting B ions with an energy of 500 to 700 KeV, and a concentration of $1\times10^{13}$ to $5\times10^{13}$ ions/cm$^2$.

6. The method as claimed in claim 1, wherein the step of implanting threshold voltage adjustment ions for low voltage NMOS transistor comprises the steps of a first implanting B ions with an energy of 70 to 120 KeV and a concentration of $5\times10^{12}$ to $2\times10^{13}$ ions/cm$^2$ and a second implanting B ions with energy of 10 to 30 KeV and a concentration of $1\times10^{12}$ to $5\times10^{12}$ ions/cm$^2$.

7. The method as claimed in claim 1, wherein the step of implanting threshold voltage adjustment ions for low voltage PMOS transistor is performed by implanting P ions with an energy of 30 to 80 KeV and a concentration of $1\times10^{12}$ to $8\times10^{12}$ ions/cm$^2$.

8. A method of manufacturing a semiconductor device having NMOS and PMOS transistors with gate insulation films of different thickness from each other comprising the steps of:

providing a semiconductor substrate in which a low voltage NMOS transistor region, a high voltage NMOS transistor region, a low voltage PMOS transistor region, and a high voltage PMOS transistor region are defined by isolation films;

forming a N well in the low and high voltage PMOS transistor regions;

implanting threshold voltage adjustment ions for low voltage PMOS transistor into the N well;

forming a P well in the low and high voltage NMOS transistor regions;

implanting threshold voltage adjustment ions for high voltage NMOS transistor into the P well;

forming a mask pattern exposing the low voltage NMOS transistor region and the high voltage PMOS transistor region on the substrate;

implanting threshold voltage adjustment ions for low voltage NMOS transistor into the exposed P well of the low voltage NMOS transistor region and the N well of the high voltage PMOS transistor region;

removing the mask pattern;

wherein the steps of implanting threshold voltage adjustment ions for the high voltage PMOS transistor, comprises the steps of:

a first implanting of P ions with a first energy and a first concentration and a second implanting of P ions with a second energy which is different from the first energy, and a second concentration which is different from the first concentration.

9. The method as claimed in claim 8, further comprising the steps of:

forming a first gate insulation film on the substrate;

removing the first gate insulation film existing on the low voltage NMOS and PMOS transistor regions; and forming a second gate insulation film on the substrate.

10. The method as claimed in claim 8, wherein the N well is formed by implanting P ions with an energy of 700 KeV to 1.5 MeV and a concentration of $1\times10^{13}$ to $5\times10^{13}$ ions/cm$^2$.

11. The method as claimed in claim 8, wherein the step of implanting threshold voltage adjustment ions for low voltage PMOS transistor, comprises the steps of a first implanting P ions with an energy of 180 to 250 KeV and a concentration of $5\times10^{12}$ to $2\times10^{13}$ ions/cm$^2$ and a second implanting P ions with an energy of 30 to 80 KeV and a concentration of $2\times10^{12}$ to $8\times10^{12}$ ions/cm$^2$.

12. The method as claimed in claim 8, wherein the P well is formed by implanting B ions with an energy of 500 to 700 KeV and a concentration of $1\times10^{13}$ to $5\times10^{13}$ ions/cm$^2$.

13. The method as claimed in claim 8, wherein the step of implanting threshold voltage adjustment ions for high voltage NMOS transistor is performed by implanting B ions with an energy of 70 to 120 KeV and a concentration of $5\times10^{12}$ to $2\times10^{13}$ ions/cm$^2$.

14. The method as claimed in claim 8, wherein the step of implanting threshold voltage adjustment ions for high voltage NMOS transistor, comprises the steps of a first implanting B ions with an energy of 70 to 120 KeV and a concentration of $5\times10^{12}$ to $2\times10^{13}$ ions/cm$^2$ and a second implanting B ions with an energy of 10 to 30 KeV and a concentration of $2\times10^{11}$ to $3\times10^{12}$ ions/cm$^2$.

15. The method as claimed in claim 8, wherein the step of implanting threshold voltage adjustment ions for low voltage NMOS transistors is performed by implanting B ions with an energy of 10 to 30 KeV and a concentration of $1\times10^{12}$ to $5\times10^{12}$ ions/cm$^2$.

* * * * *

UNITED STATES PATENT AND TRADEMARK OFFICE
CERTIFICATE OF CORRECTION

PATENT NO : 6,090,652
DATED : July 18, 2000
INVENTOR(S) : Jae-Kap Kim

It is certified that error appears in the above-identified patent and that said Letters Patent are hereby corrected as shown below:

At column 3, line 19, delete "2A" and substitute --1A--.

Signed and Sealed this

Seventeenth Day of April, 2001

Attest:

NICHOLAS P. GODICI

Attesting Officer    Acting Director of the United States Patent and Trademark Office